(12) United States Patent
Banine et al.

(10) Patent No.: US 9,207,548 B2
(45) Date of Patent: Dec. 8, 2015

(54) RADIATION SOURCE WITH A DEBRIS MITIGATION SYSTEM, LITHOGRAPHIC APPARATUS WITH A DEBRIS MITIGATION SYSTEM, METHOD FOR PREVENTING DEBRIS FROM DEPOSITING ON COLLECTOR MIRROR, AND DEVICE MANUFACTURING METHOD

(75) Inventors: Vadim Yevgenyevich Banine, Deume (NL); Erik Roelof Loopstra, Eindhoven (NL); Johannes Hubertus Josephina Moors, Helmond (NL)

(73) Assignee: ASML NETHERLANDS B.V., Veldhoven (NL)

( * ) Notice: Subject to any disclaimer, the term of this patent is extended or adjusted under 35 U.S.C. 154(b) by 785 days.

(21) Appl. No.: 13/058,776

(22) PCT Filed: Jul. 30, 2009

(86) PCT No.: PCT/EP2009/005509
§ 371 (c)(1),
(2), (4) Date: Apr. 20, 2011

(87) PCT Pub. No.: WO2010/017892
PCT Pub. Date: Feb. 18, 2010

(65) Prior Publication Data
US 2011/0188014 A1     Aug. 4, 2011

Related U.S. Application Data

(60) Provisional application No. 61/136,144, filed on Aug. 14, 2008.

(51) Int. Cl.
*G03F 7/20* (2006.01)
*H05G 2/00* (2006.01)

(52) U.S. Cl.
CPC ........ *G03F 7/70916* (2013.01); *G03F 7/70033* (2013.01); *G03F 7/70175* (2013.01); *G03F 7/70883* (2013.01); *G03F 7/70908* (2013.01); *G03F 7/70983* (2013.01); *H05G 2/003* (2013.01)

(58) Field of Classification Search
CPC ............ G03F 7/70033; G03F 7/70175; G03F 7/70883; G03F 7/70908; G03F 7/70916
See application file for complete search history.

(56) References Cited

U.S. PATENT DOCUMENTS

| | | | |
|---|---|---|---|
| 6,614,505 B2 | 9/2003 | Koster et al. | |
| 7,026,629 B2 | 4/2006 | Bakker et al. | |

(Continued)

FOREIGN PATENT DOCUMENTS

| | | |
|---|---|---|
| JP | 2003-209053 | 7/2003 |
| JP | 2005-522839 | 7/2005 |

(Continued)

OTHER PUBLICATIONS

Harilal et al., Ion Debris Mitigation from Tin Plasma Using Ambient Gas, Magnetic Field and Combined Effects, Applied Physics B, vol. 86, No. 3, Jan. 1, 2007, pp. 547-553.

(Continued)

*Primary Examiner* — Peter B Kim
*Assistant Examiner* — Michelle Iacoletti
(74) *Attorney, Agent, or Firm* — Pillsbury Winthrop Shaw Pittman LLP

(57) ABSTRACT

A lithographic apparatus includes a radiation source configured to produce extreme ultraviolet radiation, the radiation source including a chamber in which a plasma is generated; a collector mirror configured to reflect radiation emitted by the plasma; and a debris mitigation system including a gas supply system configured to supply a first gas flow toward the plasma, the first gas flow being selected to thermalize debris generated by the plasma, and a plurality of gas manifolds arranged at a location proximate the collector mirror, the gas manifolds configured to supply a second gas flow in the chamber, the second gas flow being directed toward the plasma to prevent thermalized debris from depositing on the collector mirror.

14 Claims, 5 Drawing Sheets

(56) References Cited

U.S. PATENT DOCUMENTS

| | | | |
|---|---|---|---|
| 7,167,232 B2 | 1/2007 | Banine et al. | |
| 7,271,401 B2 | 9/2007 | Imai et al. | |
| 7,626,188 B2 * | 12/2009 | Shirai et al. | 250/504 R |
| 7,642,533 B2 | 1/2010 | Partio et al. | |
| 7,705,334 B2 | 4/2010 | Yabuta et al. | |
| 8,173,975 B2 | 5/2012 | Jonkers et al. | |
| 2004/0109151 A1 * | 6/2004 | Bakker et al. | 355/69 |
| 2005/0139785 A1 | 6/2005 | Banine et al. | |
| 2005/0254029 A1 * | 11/2005 | Banine et al. | 355/53 |
| 2006/0158126 A1 | 7/2006 | Schuermann et al. | |
| 2006/0186356 A1 | 8/2006 | Imai et al. | |
| 2006/0243927 A1 * | 11/2006 | Tran et al. | 250/504 R |
| 2007/0018118 A1 * | 1/2007 | Sjmaenok et al. | 250/492.2 |
| 2008/0099699 A1 * | 5/2008 | Yabuta et al. | 250/504 R |
| 2009/0057567 A1 * | 3/2009 | Bykanov et al. | 250/429 |

FOREIGN PATENT DOCUMENTS

| | | |
|---|---|---|
| JP | 2006-80255 | 3/2006 |
| JP | 2007-517396 | 6/2007 |
| JP | 2007-220949 | 8/2007 |
| JP | 2007-531296 | 11/2007 |
| JP | 2008-53696 | 3/2008 |
| JP | 2008-108945 | 5/2008 |
| WO | 2005/096099 A | 10/2005 |
| WO | 2009/025557 A | 2/2009 |

OTHER PUBLICATIONS

International Search Report for PCT International Patent Application No. PCT/EP2009/005509, mailed Dec. 4, 2009.

Harilal et al., Ambient gas effects on the dynamics of laser-produced tin plume expansion, Journal of Applied Physics, vol. 99, Issue 8, Apr. 28, 2006, 10 pages.

* cited by examiner

RADIATION SOURCE WITH A DEBRIS MITIGATION SYSTEM, LITHOGRAPHIC APPARATUS WITH A DEBRIS MITIGATION SYSTEM, METHOD FOR PREVENTING DEBRIS FROM DEPOSITING ON COLLECTOR MIRROR, AND DEVICE MANUFACTURING METHOD

CROSS-REFERENCE TO RELATED APPLICATIONS

This application is the U.S. National Phase application of PCT/EP2009/005509, filed Jul. 30, 2009, which claims the benefit of U.S. provisional application 61/136,144, which was filed on Aug. 14, 2008, and which is incorporated herein in its entirety by reference.

FIELD

The present invention relates to a lithographic apparatus and a method for producing extreme ultraviolet radiation.

BACKGROUND

A lithographic apparatus is a machine that applies a desired pattern onto a substrate, usually onto a target portion of the substrate. A lithographic apparatus can be used, for example, in the manufacture of integrated circuits (ICs). In that example, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and, thus, reduce the minimum printable size, it has been proposed to use an extreme ultraviolet (EUV) radiation source. EUV radiation sources are configured to output a radiation wavelength of about 13 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings.

The source of EUV radiation is typically a plasma source, for example a laser-produced plasma or a discharge source. When using a plasma source, contamination particles are created as a by-product of the EUV radiation. Generally, such contamination particles are undesired, because they may inflict damage on parts of the lithographic apparatus, most notably mirrors which are located in a vicinity of the plasma source.

SUMMARY

It is desirable to mitigate the damage inflicted by contamination particles.

In an aspect of the invention, there is provided a lithographic apparatus including a radiation source configured to produce extreme ultraviolet radiation, the radiation source including a chamber in which a plasma is generated; a collector mirror configured to reflect radiation emitted by the plasma; and a debris mitigation system including a gas supply system configured to supply a first gas flow toward the plasma, the first gas flow being selected to thermalize debris generated by the plasma, and a plurality of gas manifolds arranged at a location proximate the collector mirror, the gas manifolds configured to supply a second gas flow in the chamber, the second gas flow being directed toward the plasma to prevent thermalized debris from depositing on the collector mirror. The debris may include high energy ions. Also, the debris may include Sn ions.

In another aspect of the invention, there is provided A radiation source configured to produce extreme ultraviolet radiation, the radiation source including a chamber in which a plasma is generated; a collector mirror configured to reflect radiation emitted by the plasma; and a debris mitigation system including a gas supply system configured to supply a first gas flow toward the plasma, the first gas flow being selected to thermalize debris generated by the plasma, and a plurality of gas manifolds arranged at a location proximate the collector mirror, the gas manifolds configured to supply a second gas flow in the chamber, the second gas flow being directed toward the plasma to prevent thermalized debris from depositing on the collector mirror.

In yet another aspect of the invention, there is provided a method for preventing debris produced by a plasma from depositing on a collector mirror of a plasma radiation source in a lithographic apparatus, the method including supplying a first gas flow toward the plasma, the first gas flow being configured to thermalize debris generated by the plasma; and supplying a second gas flow toward the plasma to prevent thermalized debris generated by the plasma from depositing on the collector mirror, the second gas flow being supplied with a plurality of gas manifolds arranged proximate the collector mirror.

In an embodiment of the invention, there is provided a device manufacturing method including generating a plasma that emits extreme ultraviolet radiation; collecting the extreme ultraviolet radiation with a collector mirror; converting the extreme ultraviolet radiation into a beam of radiation;

patterning the beam of radiation; projecting the beam of radiation onto a target portion of a substrate; and preventing debris produced by the plasma from depositing on the collector mirror, the preventing including supplying a first gas flow toward the plasma, the first gas flow being configured to thermalize debris generated by the plasma; and supplying a second gas flow toward the plasma to prevent thermalized debris generated by the plasma from depositing on the collector mirror, the second gas flow being supplied with a plurality of gas manifolds arranged proximate the collector mirror.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
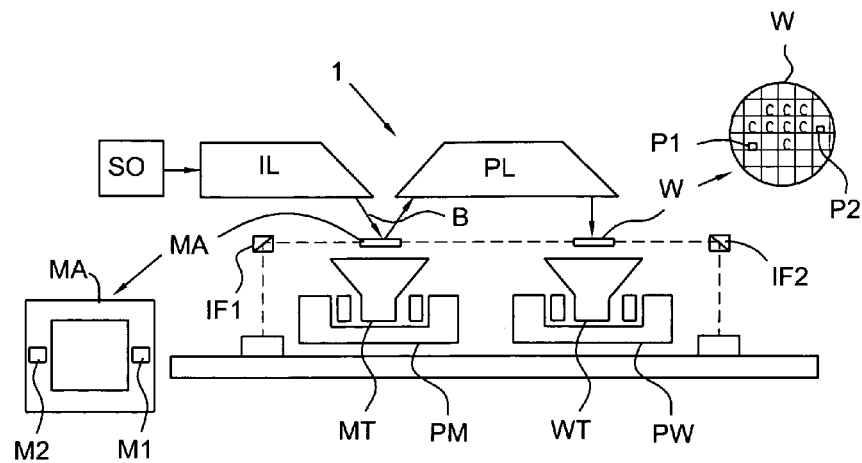
FIG. 1 schematically depicts a lithographic apparatus according to an embodiment of the invention.

FIG. 1 schematically depicts a lithographic apparatus 1 according to an embodiment of the present invention. The apparatus 1 includes an illumination system (illuminator) IL configured to condition a radiation beam B (e.g. UV radiation or EUV radiation). A patterning device support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PL is configured to project the patterned radiation beam B onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system.

Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type, for example employing a reflective mask. Alternatively, the apparatus may be of a transmissive type, for example employing a transmissive mask.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a delivery system BD (not shown in FIG. 1) including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjusting device AD (not shown in FIG. 1) configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO (not shown in FIG. 1). The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. After being reflected by the patterning device (e.g. mask) MA, the radiation beam B passes through the projection system PL, which focuses the beam onto a target portion C of the substrate W. With the aid of the second positioning device PW and a position sensor IF2 (e.g. an interferometric device, linear encoder or capacitive sensor), the substrate table WT can be moved accurately, e.g. so as to position different target portions C in the path of the radiation beam B. Similarly, the first positioning device PM and a position sensor IF1 (e.g. an interferometric device, linear encoder or capacitive sensor) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the patterning device pattern support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions. These are known as scribe-lane alignment marks. Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT are scanned synchronously while a pattern imparted to the radiation beam is projected onto a target portion C (i.e. a single dynamic exposure). The velocity and direction of the substrate table WT relative to the patterning device support (e.g. mask table) MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
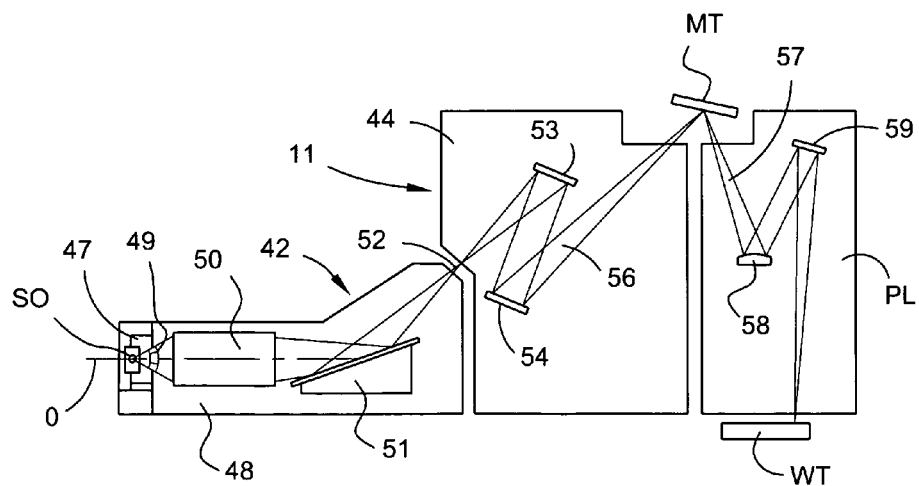
FIG. 2 schematically depicts a side view of an EUV illumination system and projection optics of a lithographic projection apparatus according to FIG. 1.

FIG. 2 shows the projection apparatus 1 in more detail, including a radiation system 42, an illumination optics unit 44, and the projection system PL. The radiation system 42 includes the radiation source SO which may be formed by a discharge plasma. EUV radiation may be produced by a gas or vapor, such as Xe gas, Li vapor or Sn vapor in which a very hot plasma is created to emit radiation in the EUV range of the electromagnetic spectrum. The very hot plasma is created by causing a partially ionized plasma of an electrical discharge to collapse onto an optical axis O. This source may be referred to as a discharge produced plasma (LPP) source. Partial pressures of 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier structure or contamination trap 49 which is positioned in or behind an opening in source chamber 47. The gas barrier structure/contamination trap 49 includes a channel structure such as, for example, described in detail in U.S. Pat. Nos. 6,614,505 and 6,359,969.

The collector chamber 48 includes a radiation collector 50 which may be formed by a grazing incidence collector. Radiation passed by collector 50 is reflected off a grating spectral filter 51 to be focused in a virtual source point 52 at an aperture in the collector chamber 48. From collector chamber 48, a radiation beam 56 is reflected in illumination optics unit 44 via normal incidence reflectors 53, 54 onto a patterning device (e.g. reticle or mask) positioned on patterning device support (e.g. reticle or mask table) MT. A patterned beam 57 is formed which is imaged in projection system PL via reflective elements 58, 59 onto wafer stage or substrate table WT. More elements than shown may generally be present in illumination optics unit 44 and projection system PL.

The radiation collector 50 may be a collector as described in European patent application 03077675.1, which is incorporated herein by reference.

Alternatively, in other embodiments, the radiation collector is one or more of a collector configured to focus collected radiation into the radiation beam emission aperture; a collector having a first focal point that coincides with the source and a second focal point that coincides with the radiation beam emission aperture; a normal incidence collector; a collector having a single substantially ellipsoid radiation collecting surface section; and a Schwarzschild collector having two radiation collecting surfaces.

Also, in another embodiment, the radiation source SO may be a laser produced plasma (LPP) source including a light source that is configured to focus a beam of coherent light, of a predetermined wavelength, onto a fuel.

Figure 3:
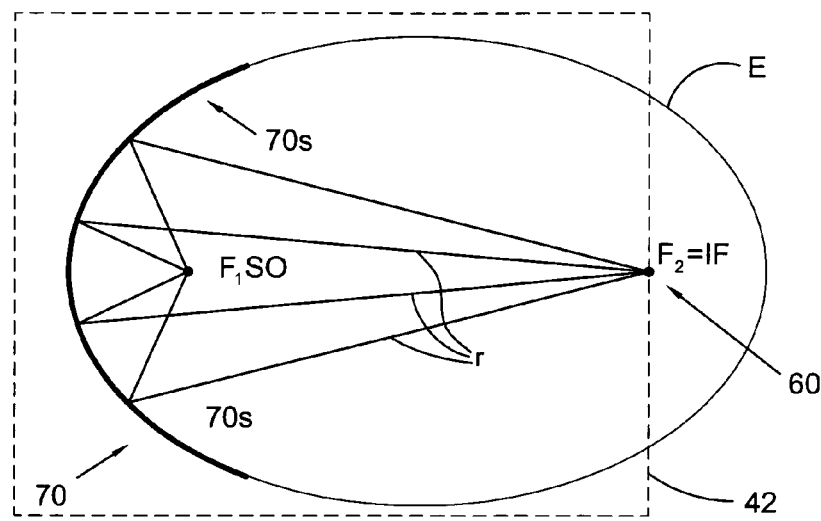
FIG. 3 depicts a radiation source and a normal incidence collector in accordance with an embodiment of the invention.

For example, FIG. 3 shows an embodiment of a radiation system 42, in cross-section, including a normal incidence collector 70. The collector 70 has an elliptical configuration, having two natural ellipse focus points F1, F2. Particularly, the normal incidence collector includes a collector having a single radiation collecting surface 70s having the geometry of the section of an ellipsoid. In other words: the ellipsoid radiation collecting surface section extends along a virtual ellipsoid (part of which is depicted by as dotted line E in the drawing).

As will be appreciated by the skilled person, in case the collector mirror 70 is ellipsoidal (i.e., including a reflection surface 70s that extends along an ellipsoid), it focuses radiation from one focal point F1 into another focal point F2. The focal points are located on the long axis of the ellipsoid at a distance $f=(a2-b2)^{1/2}$ from the center of the ellipse, where 2a and 2b are the lengths of the major and minor axes, respectively. In case that the embodiment shown in FIG. 1 includes an LPP radiation source SO, the collector may be a single ellipsoidal mirror as shown in FIG. 3, where the light source SO is positioned in one focal point (F1) and an intermediate focus IF is established in the other focal point (F2) of the mirror. Radiation emanating from the radiation source, located in the first focal point (F1) towards the reflecting surface 70s and the reflected radiation, reflected by that surface towards the second focus point F2, is depicted by lines r in the drawing. For example, according to an embodiment, a mentioned intermediate focus IF may be located between the collector and an illumination system IL (see FIGS. 1, 2) of a lithographic apparatus, or be located in the illumination system IL, if desired.

Figure 4:
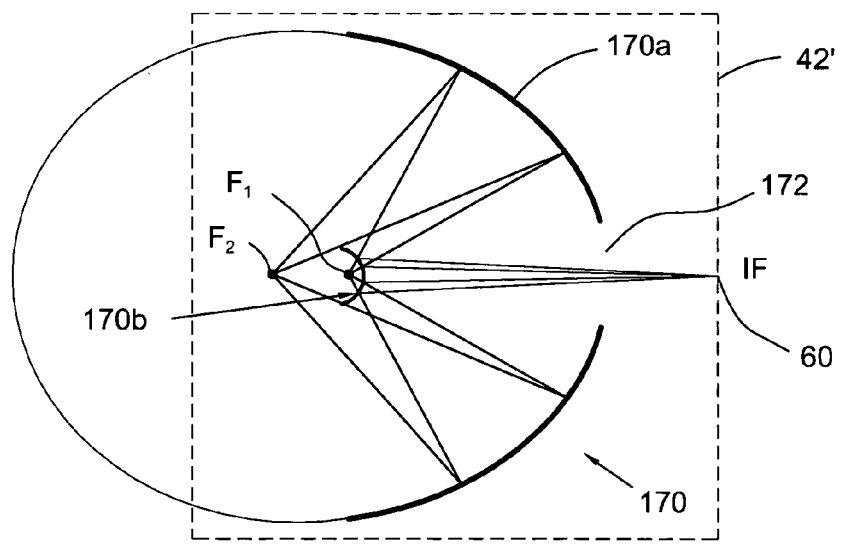
FIG. 4 depicts a radiation source and a Schwarzschild type normal incidence collector in accordance with an embodiment of the invention.

FIG. 4 schematically shows a radiation source unit 42' in accordance with an embodiment of the invention, in cross-section, including a collector 170. In this case, the collector includes two normal incidence collector parts 170a, 170b, each part 170a, 170b preferably (but not necessarily) having a substantially ellipsoid radiation collecting surface section. Particularly, the embodiment of FIG. 4 includes a Schwarzschild collector design, preferably consisting of two mirrors 170a, 170b. The source SO may be located in a first focal point F1. For example, the first collector mirror part 170a may have a concave reflecting surface (for example of ellipsoid or parabolic shape) that is configured to focus radiation emanating from the first focal point F1 towards the second collector mirror part 170b, particularly towards a second focus point F2. The second mirror part 170b may be configured to focus the radiation that is directed by the first mirror part 170a towards the second focus point F2, towards a further focus point IF (for example an intermediate focus). The first mirror part 170a includes an aperture 172 via which the radiation (reflected by the second mirror 170b) may be transmitted towards the further focus point IF. For example, the embodiment of FIG. 4 may beneficially be used in combination with a DPP radiation source.

The radiation collector 70 may be configured to collect radiation generated by the source, and to focus collected radiation to the downstream radiation beam emission aperture 60 of the radiation system 42.

For example, the source SO may be configured to emit diverging radiation, and the collector 70 may be arranged to reflect that diverging radiation to provide a converging radiation beam, converging towards the emission aperture 60 (as in FIGS. 3 and 4). Particularly, the collector 70 may focus the radiation onto a focal point IF on an optical axis O of the system (see FIG. 2), which focal point IF is located in the emission aperture 60.

The emission aperture 60 may be a circular aperture, or have another shape (for example elliptical, square, or another shape). The emission aperture 60 is preferably small, for example having a diameter less than about 10 cm, preferably less than 1 cm, (measured in a direction transversally with a radiation transmission direction T, for example in a radial direction in case the aperture 60 has a circular cross-section). Preferably, the optical axis OX extends centrally through the aperture 60, however, this is not essential.

When using a laser produced plasma (LPP) source or discharge produced plasma (DPP) source, a large amount of debris may be produced in the form of fast ions and/or neutral particles (for example Tin). Such debris may cause rapid reflectivity loss of the collector mirrors 50, 70, 170 shown in FIGS. 2-4. If unprotected, the lifetime of the collector mirrors 50, 70, 170 could be as short as several minutes, while the target is several months.

In order to mitigate the damage inflicted by the particle radiation on the collector mirrors 50, 70 and 170, it is proposed to use a gas curtain around the plasma. In an embodiment, the gas curtain is used in combination with a Peclet type suppression of debris generated by the plasma to deflect particles including fast ions (e.g. tin ions). The Peclet effect describes the rate of advection of a flow to its rate of diffusion, often thermal diffusion. It is equivalent to the product of the Reynolds number and the Prandtl number in the case of thermal diffusion, and the product of the Reynolds number and the Schmidt number in the case of mass dispersion. As is known in the art, advection is a transport mechanism of a substance or a conserved property with a moving fluid.

Figure 5:
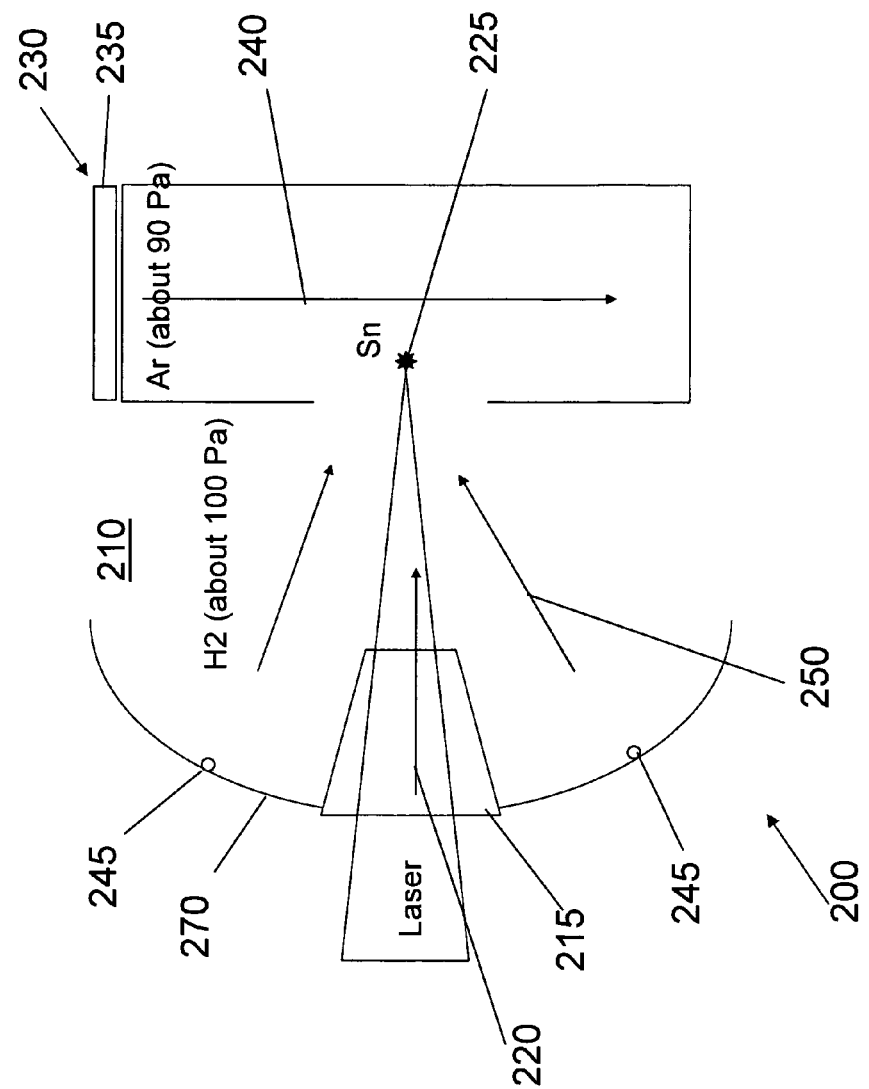
FIG. 5 depicts a radiation source including a debris mitigation system in accordance with an embodiment of the invention.

Referring now to FIG. 5, this figure shows a cross section of a plasma source 200 in accordance with an embodiment of the invention. The plasma source 200 includes a plasma chamber 210 that contains an atmosphere of hydrogen at a pressure of about 100 Pa. The chamber 210 further includes a nozzle 215 that is configured to allow a radiation beam 220 to pass therethrough and a collector mirror 270. As depicted here, the source is a laser produced plasma source. The radiation beam 220 (e.g. a laser beam) generated by a radiation source (not shown in FIG. 6) is configured to ignite a fuel (e.g. tin) to generate a plasma 225. The plasma emits a beam of radiation including extreme ultraviolet radiation that is collected and reflected by the collector mirror 270.

The plasma source further includes a debris mitigation system 230 that includes one or more gas outlets 235 configured, in use, to supply a gas flow 240 toward the plasma 225. The gas flow 240 is directed along a direction that is substantially perpendicular to the direction of propagation of the radiation beam 220. The gas flow 240 acts as a gas curtain that is configured to thermalize ions (e.g. tin ions) generated by the plasma 225. In an embodiment, the gas flow contains argon and has a pressure of about 90 Pa. It is contemplated that the argon pressure may be higher or lower depending on the geometry of the source.

As shown in FIG. 5, the debris mitigation system 230 further includes a gas supply system 245 that is adapted to supply a gas flow 250 toward the plasma 225. The gas flow 250 effectively prevents debris generated by the plasma 225 (e.g. tin ions) from depositing on the collector mirror 270 using the Peclet effect. In an embodiment, the gas flow 250 contains hydrogen.

The use of the gas supply system 245 alone may not be sufficient to effectively protect the collector mirror 270. Indeed, high energy ions may not be fully stopped by the gas counterflow of hydrogen 250 due to the limited transfer of momentum per collision between hydrogen and ions (e.g. tin ions). As a result, it is highly desirable to first thermalize the high energy ions generated by the plasma 225 before purging these ions away from the collector mirror 270. Ion thermalization is particularly desirable with the use of a laser produced plasma (LLP) source, which generates ions having an energy in the range of about 3-7 keV. For comparison, a discharge produced plasma (DPP) source generates ions with an energy of about 100 keV. Thus, a hydrogen gas flow of 2 Pa*m in a DPP source may be sufficient to effectively stop ionized particles generated by the plasma 225.

Thermalization of high energy ions with the gas curtain 240 is much faster due to the higher mass of argon relative to hydrogen. After being thermalized, high energy ions are effectively prevented from reaching the collector mirror 270 by Peclet effect due to the hydrogen gas flow 250. Argon supplied by the gas outlets 235 is contained by a hydrogen pressure in the collector chamber and by the gas flow 250. As a result, extreme ultraviolet loss is limited to the outlet region only. The gas constituency outside the outlet region is not significantly changed.

Figure 6:
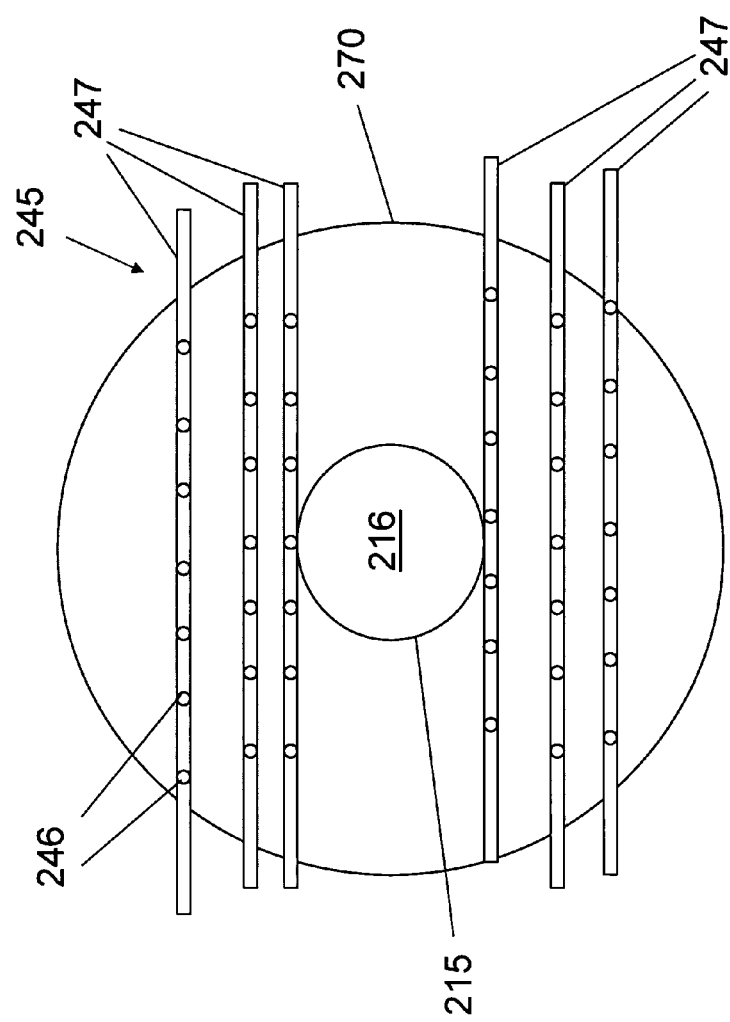
FIG. 6 shows a front view of the collector mirror in accordance with an embodiment of the invention.

Referring now to FIG. 6, this figure shows the gas supply system 245 in accordance with an embodiment of the invention. The gas supply system 245 is arranged at a location proximate the collector mirror 270. The gas supply system 245 may include a plurality of gas manifolds 247 that are located on opposite sides of the nozzle 215 and extend substantially along the length of the mirror 270. The nozzle 215 defines an aperture 216 that allows the laser beam of radiation that ignites the fuel to pass therethrough. The manifolds 247 each include a plurality of gas outlets 246 that supply the flow of hydrogen 250. The gas outlets of the manifolds are dimensioned and arranged to direct the flow of hydrogen toward the plasma 225. It will be appreciated that the number of outlets 246 and manifolds 247 may vary depending on the size of the plasma source.

In an embodiment, the diameter of the manifolds is relatively small compared to the surface of the collector mirror 270 such that substantially all the radiation emitted by the plasma is collected and reflected by the mirror. As can be seen in FIG. 6, the plurality of manifolds 247 are arranged at a location proximate the collector mirror 270. In an embodiment, the manifolds may be attached to the surface of the collector mirror 270. Alternatively, the manifolds may be provided at a small distance from the surface of the mirror, e.g. in a range of a few millimeters or a few centimeters.

The manifolds 247 are positioned in the chamber 210 such that the gas outlets 246 are oriented toward the plasma 225. The flow of gas 250 may be continuously supplied by the manifolds 247 during generation of the plasma. With the chamber configuration of FIGS. 5 and 6, the debris (e.g. tin ions) generated by the plasma substantially do not reach the surface of the collector mirror 270. Specifically, the flow of debris is thermalized by the gas flow 240 and then suppressed by the hydrogen flow 250 due to the Peclet effect. A gas collection system may be arranged in the chamber 210 to collect the debris generated by the plasma.

While the manifolds 247 of FIG. 6 are configured to supply hydrogen, it will be appreciated that another gas or a mixture of gases could be used in another embodiment of the invention. Further, it is contemplated that various other arrangements may be used to prevent mixing of the gas flow 240 (e.g. argon) in the chamber 210. For example, in an embodiment, the gas flow 240 may be supplied at a smaller pressure than hydrogen. In another embodiment, the gas flow 240 may be supersonic. A pump may also be provided downstream of the plasma 225 at the bottom of the source 200 to collect the gas flow 240.

Figure 7:
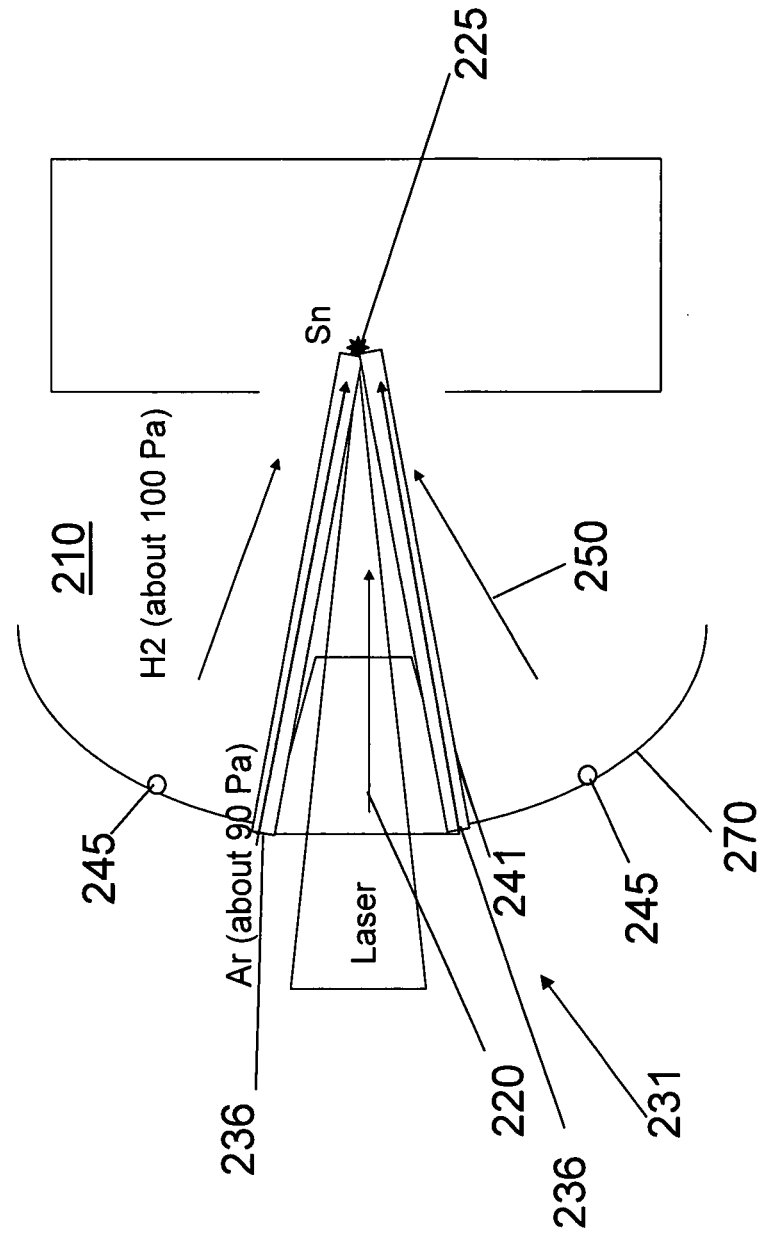
FIG. 7 depicts a radiation source including a debris mitigation system in accordance with an embodiment of the invention.

FIG. 7 shows a radiation source including a debris mitigation system 231 in accordance with an embodiment of the invention. The principle of operation of the debris mitigation system 231 is substantially the same as that described in FIG. 5. The debris mitigation system 231 is adapted to be used in connection with a gas supply system 245 that is configured to prevent debris generated by the plasma 225 from reaching the collector mirror 270. The debris mitigation system 231 includes gas outlets 236 that supply a gas flow 241 toward the plasma 225. Gas flow 241 contains a gas that is selected to thermalize ions generated by the plasma 225. Thermalized ions may then be suppressed by gas flow (e.g. hydrogen) 250 generated by the gas supply system 245 using the Peclet effect. In an embodiment of the invention, the gas supplied by gas outlets 236 is argon. The argon may be supplied at a pressure of about 90 Pa. The atmosphere of hydrogen at a pressure of about 100 Pa.

In the embodiment of FIG. 7, the gas flow 241 is substantially directed toward the plasma 225. In order to prevent the gas flow 241 from diffusing in the volume of the collector and the source chamber 210, the gas flow may be supersonic.

It will be appreciated that the number of gas outlets 246 may vary substantially in other embodiments of the invention. For example, a plurality of gas outlets 246 may be arranged around the source chamber 210 to ensure proper thermalization of the high energy ions. In an embodiment, the gas outlets 246 may be provided within the collector mirror 270. Alternatively, the gas outlets 246 may be provided in the form of a plurality of gas manifolds similarly to the manifolds 247 of FIG. 6. Further, a gas collection system (not shown in FIG. 7) may be provided downstream of the chamber 210 at one or more appropriate locations along the direction of the gas flow 246 to collect the gas flow 246.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention is not limited to application of the lithographic apparatus or use in the lithographic apparatus as described in the embodiments. Further, the drawings usually only include the elements and features that are necessary to understand the invention. Beyond that, the drawings of the lithographic apparatus are schematically and not on scale. The invention is not limited to those elements, shown in the schematic drawings (e.g. the number of mirrors drawn in the schematic drawings). Further, the invention is not confined to the lithographic apparatus described in FIGS. 1 and 2. The person skilled in the art will understand that embodiments described above may be combined. Further, the invention is not limited to protection against, for example Sn from a source SO, but also other particles from other sources.

What is claimed is:

1. A lithographic apparatus comprising:
a radiation source configured to produce extreme ultraviolet radiation, the radiation source including
a chamber in which a plasma is generated;
a collector mirror having a surface configured to reflect radiation emitted by the plasma towards a focal point; and
a debris mitigation system including
a gas supply system configured to supply a first gas flow toward the plasma in a direction substantially perpendicular to a direction of propagation of the radiation reflected by the collector mirror towards the focal point to form a gas curtain around the plasma, the first gas flow being selected to thermalize debris generated by the plasma, and
a plurality of gas manifolds arranged at a location between the plasma and the surface of the collector mirror and proximate the surface of the collector mirror and extending substantially along a length of the collector mirror, each gas manifold having a diameter and a plurality of gas outlets configured to supply a second gas flow in the chamber, the second gas flow being directed toward the plasma to prevent thermalized debris from depositing on the collector mirror.

2. The apparatus of claim 1, wherein the debris are suppressed using the Peclet effect.

3. The apparatus of claim 1, wherein the radiation source is a laser-produced plasma source or a discharge-produced plasma source.

4. The apparatus of claim 1, wherein the chamber contains hydrogen.

5. The apparatus of claim 4, wherein the pressure of hydrogen is about 100 Pa.

6. The apparatus of claim 1, wherein gas in the second gas flow is hydrogen.

7. The apparatus of claim 1, wherein gas in the first gas flow is argon.

8. The apparatus of claim 1, wherein gas in the first gas flow has a pressure that is lower than the gas in the second gas flow.

9. The apparatus of claim 1, wherein the first gas flow is supersonic.

10. The apparatus of claim 1, wherein the gas supply system includes one or more outlets arranged proximate the collector mirror.

11. The apparatus of claim 1, wherein the plurality of manifolds are attached to the surface of the collector mirror.

12. A radiation source configured to produce extreme ultraviolet radiation, the radiation source comprising:
a chamber in which a plasma is generated;
a collector mirror having a surface configured to reflect radiation emitted by the plasma towards a focal point; and
a debris mitigation system including
a gas supply system configured to supply a first gas flow toward the plasma in a direction substantially perpendicular to a direction of propagation of the radiation reflected by the collector mirror towards the focal point to form a gas curtain around the plasma, the first gas flow being selected to thermalize debris generated by the plasma, and
a plurality of gas manifolds arranged at a location between the plasma and the surface of the collector mirror and proximate the surface of the collector mirror and extending substantially along a length of the collector mirror, each gas manifold having a diameter and a plurality of gas outlets configured to supply a second gas flow in the chamber, the second gas flow being directed toward the plasma to prevent thermalized debris from depositing on the collector mirror.

13. A method for preventing debris produced by a plasma from depositing on a collector mirror of a plasma radiation source in a lithographic apparatus, the method comprising:
supplying a first gas flow toward the plasma in a direction substantially perpendicular to a direction of propagation of radiation reflected by the collector mirror towards a focal point to form a gas curtain around the plasma, the first gas flow being configured to thermalize debris generated by the plasma; and
supplying a second gas flow toward the plasma to prevent thermalized debris generated by the plasma from depositing on a reflective surface of the collector mirror, the second gas flow being supplied with a plurality of gas manifolds arranged at a location between the plasma and the reflective surface of the collector mirror and proximate the reflective surface of the collector mirror and extending substantially along a length of the collector mirror, each gas manifold having a diameter and a plurality of openings through which the second gas flow is supplied.

14. A device manufacturing method comprising:
generating a plasma that emits extreme ultraviolet radiation;
collecting the extreme ultraviolet radiation with a collector mirror having a reflective surface;
converting the extreme ultraviolet radiation into a beam of radiation;
patterning the beam of radiation;

projecting the beam of radiation onto a target portion of a substrate; and preventing debris produced by the plasma from depositing on the collector mirror, the preventing including supplying a first gas flow toward the plasma in a direction substantially perpendicular to a direction of propagation of the beam of radiation to form a gas curtain around the plasma, the first gas flow being configured to thermalize debris generated by the plasma; and supplying a second gas flow toward the plasma to prevent thermalized debris generated by the plasma from depositing on the collector mirror, the second gas flow being supplied with a plurality of gas manifolds arranged at a location between the plasma and the reflective surface of the collector mirror and proximate the reflective surface of the collector mirror and extending substantially along a length of the collector mirror, each gas manifold having a diameter and a plurality of openings through which the second gas flow is supplied.

* * * * *